United States Patent
Yu et al.

(10) Patent No.: US 9,794,087 B2
(45) Date of Patent: Oct. 17, 2017

(54) ASYMMETRIC ON-STATE RESISTANCE DRIVER OPTIMIZED FOR MULTI-DROP DDR4

(71) Applicant: Integrated Device Technology, Inc., San Jose, CA (US)

(72) Inventors: Yue Yu, Johns Creek, GA (US); Craig DeSimone, Dacula, GA (US); Al Xuefeng Fang, Suwanee, GA (US); Yanbo Wang, Duluth, GA (US)

(73) Assignee: INTEGRATED DEVICE TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 15/059,609

(22) Filed: Mar. 3, 2016

(65) Prior Publication Data
US 2017/0256303 A1 Sep. 7, 2017

(51) Int. Cl.
*H04L 25/02* (2006.01)
*G11C 11/4094* (2006.01)
*G11C 11/4096* (2006.01)
*G11C 11/4093* (2006.01)
*G06F 13/40* (2006.01)

(52) U.S. Cl.
CPC ...... *H04L 25/0278* (2013.01); *G11C 11/4093* (2013.01); *G11C 11/4094* (2013.01); *G11C 11/4096* (2013.01); *G06F 13/4086* (2013.01)

(58) Field of Classification Search
CPC ............. H04L 25/0278; G11C 11/4093; G11C 11/4096; G11C 11/4094; G06F 13/4086
See application file for complete search history.

(56) References Cited

U.S. PATENT DOCUMENTS

| | | | |
|---|---|---|---|
| 8,779,819 B1* | 7/2014 | Venditti | H03K 5/086 327/170 |
| 2004/0008054 A1* | 1/2004 | Lesea | H04L 25/0278 326/30 |
| 2010/0001758 A1* | 1/2010 | Dreps | G06F 13/4086 326/30 |
| 2015/0063041 A1* | 3/2015 | Arai | G11C 7/1057 365/189.05 |
| 2015/0103479 A1* | 4/2015 | Ware | G11C 11/4093 361/679.31 |

\* cited by examiner

*Primary Examiner* — Harry W Byrne
*Assistant Examiner* — Ajay Ojha
(74) *Attorney, Agent, or Firm* — Christopher P. Maiorana, PC

(57) ABSTRACT

An apparatus comprising a plurality of driver circuits and a plurality of control registers. The plurality of driver circuits may be configured to modify a memory signal that transfers read data across a read line to a memory controller. The plurality of control registers may be configured to enable one or more of the driver circuits. A pull up strength and a pull down strength of the memory signal may be configured in response to how many of the plurality of driver circuits are enabled. The plurality of driver circuits implement an asymmetric pull up and pull down of the memory signal.

20 Claims, 7 Drawing Sheets

ASYMMETRIC ON-STATE RESISTANCE DRIVER OPTIMIZED FOR MULTI-DROP DDR4

FIELD OF THE INVENTION

The present invention relates to memory circuits generally and, more particularly, to a method and/or apparatus for implementing an asymmetric on-state resistance driver optimized for multi-drop DDR4.

BACKGROUND OF THE INVENTION

Capacitive and inductive load impedances on output drivers of conventional memory cards result in weak output eye performance at high frequencies. Distortion caused by pins, connectors and traces from the memory card across a data bus to other circuitry limits an upper frequency for reliable data transmission. Degradation of the output eye results in poorer receiver margin tests. In conventional driver designs, for a multi-drop double-data rate fourth generation (DDR4) memory channel where an off-target termination is VDD referenced, having a symmetric pullup/pulldown Ron driver would introduce significantly more reflection due to extra drive strength already present on the line from off target terminations.

It would be desirable to implement an asymmetric on-state resistance driver optimized for multi-drop DDR4.

SUMMARY OF THE INVENTION

The present invention concerns an apparatus comprising a plurality of driver circuits and a plurality of control registers. The plurality of driver circuits may be configured to modify a memory signal that transfers read data across a read line to a memory controller. The plurality of control registers may be configured to enable one or more of the driver circuits. A pull up strength and a pull down strength of the memory signal may be configured in response to how many of the plurality of driver circuits are enabled. The plurality of driver circuits implement an asymmetric pull up and pull down of the memory signal.

BRIEF DESCRIPTION OF THE DRAWINGS

Embodiments of the invention will be apparent from the following detailed description and the appended claims and drawings in which:

DETAILED DESCRIPTION OF THE PREFERRED EMBODIMENTS

Embodiments of the present invention include providing an asymmetric on-state resistance driver optimized for multi-drop DDR4 that may (i) improve an output eye performance, (ii) improve an integrity of the output signal at a receiving end, (iii) improve receiver margin tests, (iv) reduce high side reflection, (v) drive stronger low side levels and/or (vi) be cost effective to implement.

An asymmetric on-state resistance driver may increase and/or optimize an output eye performance (or opening) for a memory system. In double data rate fourth generation (DDR4) applications, a pull up impedance may be specified to connect to the positive rail VDD on a memory channel, so a natural imbalance generally exists. A specification for DDR4 memory may also include impedance linearity criteria. In some embodiments, the asymmetrical driver may operate outside of the specification for DDR4 memory.

Figure 1:
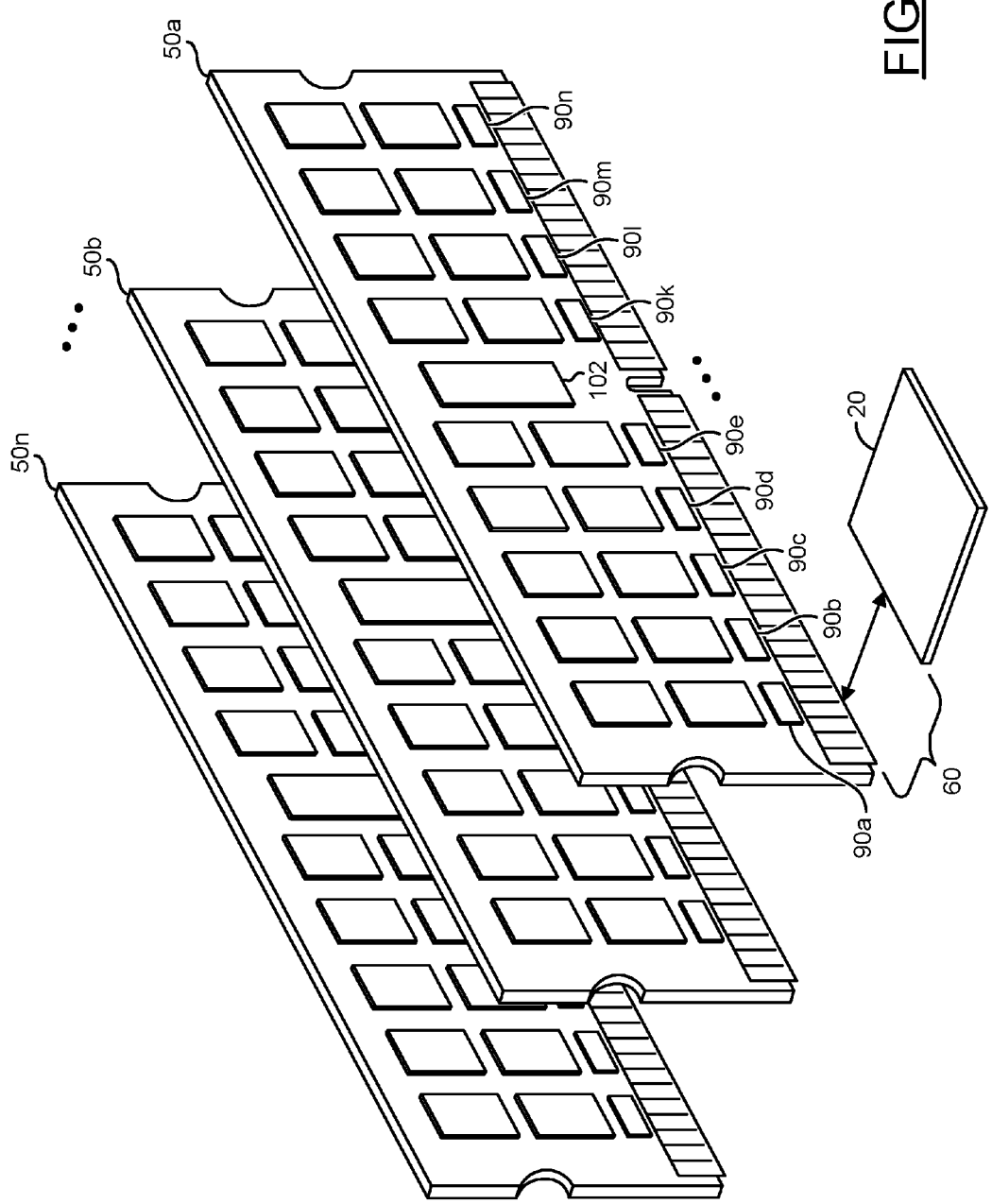
FIG. 1 is a diagram illustrating an example embodiment.

Referring to FIG. 1, a diagram illustrating a number of example circuits 50a-50n are shown. In an example, circuits 50a-50n may be implemented as memory modules (or boards). For example, the memory modules 50a-50n may be implemented as double data rate fourth generation (DDR4) synchronous dynamic random-access memory (SDRAM) modules. The memory modules 50a-50n may comprise a number of blocks (or circuits) 90a-90n, a block (or circuit) 102, and/or various other blocks, circuits, pins, connectors and/or traces. The circuits 90a-90n may be configured as data buffers. The circuit 102 may be implemented as a registered clock driver (RCD). In an example, the RCD circuit 102 may be implemented as a DDR4 RCD circuit. The type, arrangement and/or number of components of the memory modules 50a-50n may be varied to meet the design criteria of a particular implementation.

The memory modules 50a-50n are shown connected to a block (or circuit) 20. The circuit 20 may be a memory controller. The circuit 20 may be located in another device, such as a computing engine. Various connectors/pins/traces 60 may be implemented to connect the memory modules 50a-50n to the memory controller 20. In some embodiments, the connectors/pins/traces 60 may be a 288-pin configuration. In an example, the memory controller 20 may be a component of a computer motherboard. In another example, the memory controller 20 may be a component of a microprocessor. In yet another example, the memory controller 20 may be a component of a central processing unit (CPU).

In an example, some of the connectors/pins/traces 60 may be part of the memory modules 50a-50n and some of the connectors/pins/traces 60 may be part of the motherboard and/or memory controller 20. The memory modules 50a-50n may be connected to a computer motherboard (e.g., by pins, traces and/or connectors 60) to transfer data between components of a computing device and the memory modules 50a-50n. In an example, the memory controller 20 may be implemented on a northbridge of a motherboard and/or as a component of a microprocessor (e.g., an Intel CPU, an AMD CPU, an ARM CPU, etc.). The implementation of the memory controller 20 may be varied according to the design criteria of a particular implementation.

In various embodiments, the memory modules 50a-50n may be DDR4 SDRAM memory modules. The DDR4 SDRAM memory modules 50a-50n may have a memory module density of 512 gigabyte (GB), terabyte, or higher per module (e.g., compared to 128 GB per dual in-line memory module (DIMM) in DDR3). The DDR4 SDRAM memory modules 50a-50n may operate at voltages of 1.2-1.35 volts (V) with a frequency between 800-2133 megahertz (MHZ) (e.g., compared to 1.5-1.65V at frequencies between 400-1067 MHz in DDR3). In some embodiments, the memory modules 50a-50n may be implemented as low voltage DDR4 and operate at 1.05V. For example, the DDR4

SDRAM memory modules 50a-50n may implement 35% power savings compared to DDR3 memory. The DDR4 SDRAM memory modules 50a-50n may transfer data at speeds of 2.13-4.26 giga-transfers per second (GT/s) and higher (e.g., compared to 0.8-2.13 GT/s in DDR3). The operating parameters of the memory modules 50a-50n may be varied according to the design criteria of a particular implementation.

In an example, the memory modules 50a-50n may be compliant with the DDR4 specification titled "DDR4 SDRAM", specification JESD79-4A, November 2013, published by the Joint Electron Device Engineering Council (JEDEC) Solid State Technology Association, Arlington, Va. Appropriate sections of the DDR4 specification are hereby incorporated by reference in their entirety.

The memory modules 50a-50n may be implemented as DDR4 load reduced DIMM (LRDIMM) or DDR4 registered DIMM (RDIMM). The data buffers 90a-90n may allow the memory modules 50a-50n in a DDR4 LRDIMM configuration to operate at higher bandwidth and/or at higher capacities compared to DDR4 RDIMM (e.g., 1333 MT/s for DDR4 LRDIMM compared to 1067 MT/s for DDR4 RDIMM at 384 GB capacity). For example, compared to DDR4 RDIMM configurations, the DDR4 LRDIMM configuration of the memory modules 50a-50n may allow improved signal integrity on data signals, lower component latency through the data buffers 90a-90n and/or better intelligence and/or post-buffer awareness by the memory controller 20.

Figure 2:
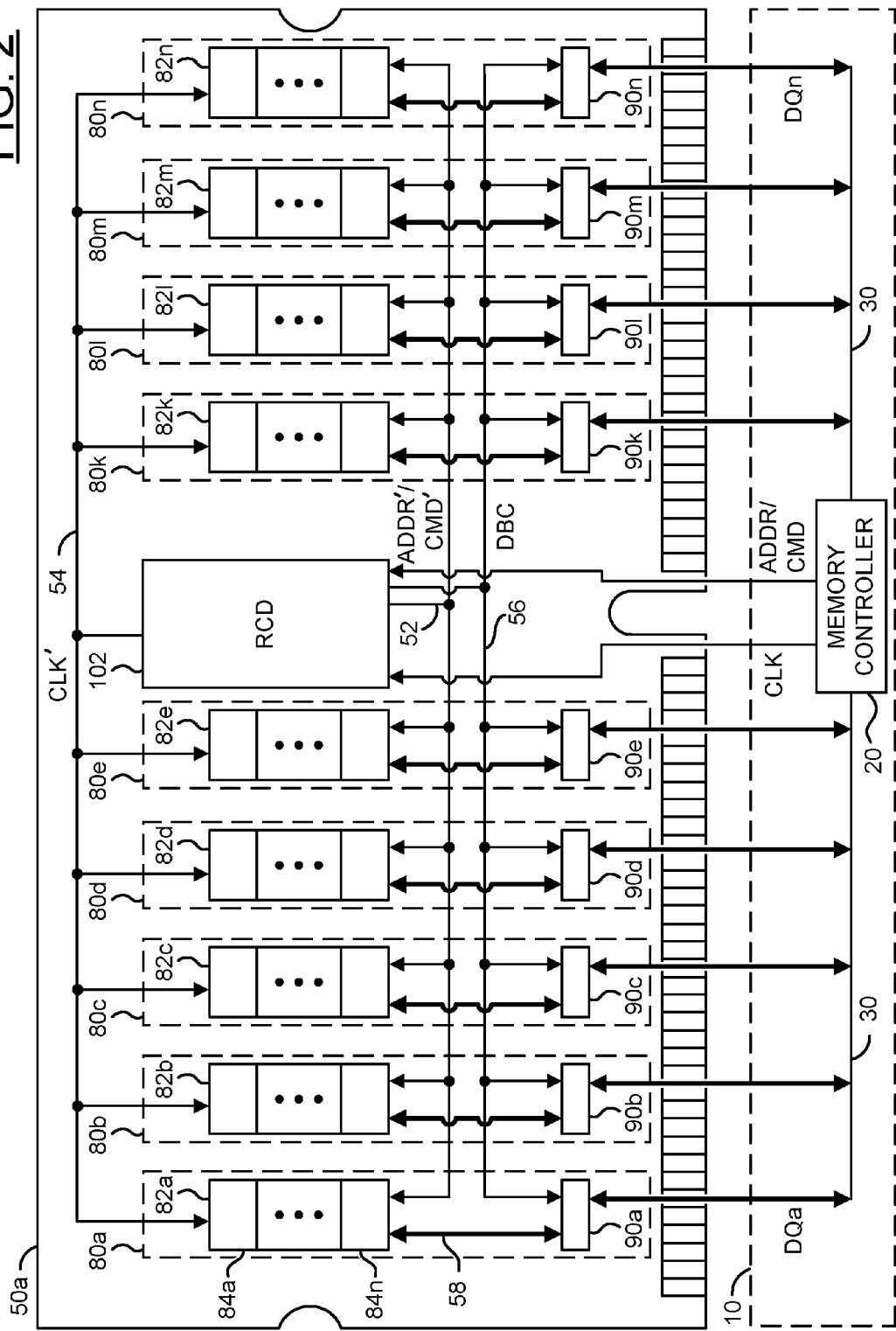
FIG. 2 is a block diagram illustrating a memory module.

Referring to FIG. 2, a block diagram 50a illustrating a memory module is shown. The memory module 50a may be representative of the memory modules 50b-50n. The memory module 50a is shown communicating with the memory controller 20. The memory controller 20 is shown as part of a block (or circuit) 10. The circuit 10 may be a motherboard, or other electronic component or computing engine that communicates with the memory module 50a.

The memory module 50a may comprise one or more blocks (or circuits) 80a-80n and/or the RCD circuit 102. The circuits 80a-80n may implement data paths of the memory module 50a. For example, the data path 80a may include the blocks 82a and/or the data buffer 90a. The data paths 80b-80n may have a similar implementations. The circuits 82a-82n may each be implemented as a memory channel. Each of the memory channels 82a-82n may comprise a number of blocks (or circuits) 84a-84n. The circuits 84a-84n may be implemented as random access memory (RAM) chips. For example, the RAM chips 84a-84n may implement a volatile memory such as dynamic RAM (DRAM). In some embodiments, the RAM chips 84a-84n may be physically located on both sides (e.g., the front and back) of the circuit board of the memory modules 50a-50n. A capacity of memory on the memory module 50a may be varied according to the design criteria of a particular implementation.

The memory controller 20 may generate a signal (e.g., CLK) and a number of control signals (e.g., ADDR/CMD). The signal CLK and/or the signals ADDR/CMD may be presented to the RCD circuit 102. A data bus 30 may be connected between the memory controller 20 and the data paths 80a-80n. The memory controller 20 may generate and/or receive data signals (e.g., DQa-DQn) that may be presented/received from the data bus 30. The signals DQa-DQn may be presented to each of the data paths 80a-80n.

The RCD circuit 102 may be configured to communicate with the memory controller 20, the memory channels 82a-82n and/or the data buffers 90a-90n. The RCD circuit 102 may decode instructions received from the memory controller 20. For example, the RCD circuit 102 may receive register command words (RCWs). In another example, the RCD circuit 102 may receive buffer control words (BCWs). The RCD circuit 102 may be configured to train the DRAM chips 84a-84n, the data buffers 90a-90n and/or command and address lines between the memory controller 20. For example, the RCWs may flow from the memory controller 20 to the RCD circuit 102. The RCWs may be used to configure the RCD circuit 102.

The RCD circuit 102 may be used in both LRDIMM and RDIMM configurations. The RCD circuit 102 may implement a 32-bit 1:2 command/address register. The RCD circuit 102 may support an at-speed bus (e.g., a BOOM bus between the RCD circuit 102 and the data buffers 90a-90n). The RCD circuit 102 may implement automatic impedance calibration. The RCD circuit 102 may implement command/address parity checking. The RCD circuit 102 may control register RCW readback. The RCD circuit 102 may implement a 1 MHz inter-integrated circuit ($I^2C$) bus (e.g., a serial bus). Inputs to the RCD circuit 102 may be pseudo-differential using external and/or internal voltages. The clock outputs, command/address outputs, control outputs and/or data buffer control outputs of the RCD circuit 102 may be enabled in groups and independently driven with different strengths.

The RCD circuit 102 may receive the signal CLK and/or the signals ADDR/CMD from the memory controller 20. Various digital logic components of the RCD circuit 102 may be used to generate signals based on the signal CLK and/or the signals ADDR/CMD and/or other signals (e.g., RCWs). The ROD circuit 102 may also be configured to generate a signal (e.g., CLK') and signals (e.g., ADDR'/CMD'). For example, the signal CLK' may be a signal Y_CLK in the DDR4 specification. The signal CLK' and/or the signals ADDR'/CMD' may be presented to each of the memory channels 82a-82n. For example, the signals CLK' and/or ADDR'/CMD' may be transmitted on a common bus 54. The RCD circuit 102 may generate one or more signals (e.g., DBC). The signals DBC may be presented to the data buffers 90a-90n. The signals DBC may be transmitted on a common bus 56 (e.g., a data buffer control bus).

The data buffers 90a-90n may be configured to receive data from the bus 56. The data buffers 90a-90n may be configured to generate/receive data to/from the bus 30. The bus 30 may comprise traces, pins and/or connections between the memory controller 20 and the data buffers 90a-90n. A bus 58 may carry the data between the data buffers 90a-90n and the memory channels 82a-82n. The data buffers 90a-90n may be configured to buffer data on the buses 30 and 58 for write operations (e.g., data transfers from the memory controller 20 to the corresponding memory channels 82a-82n). The data buffers 90a-90n may be configured to buffer data on the buses 30 and 58 for read operations (e.g., data transfers from the corresponding memory channels 82a-82n to the memory controller 20).

The data buffers 90a-90n may exchange data with the DRAM chips 84a-84n in small units (e.g., 4-bit nibbles). In various embodiments, the DRAM chips 84a-84n may be arranged in multiple (e.g., two) sets. For two set/two DRAM chip 84a-84b implementations, each set may contain a single DRAM chips 84a-84n. Each DRAM chip 84a-84b may be connected to the respective data buffers 90a-90n through an upper nibble and a lower nibble. For two set/four DRAM chip 84a-84d implementations, each set may contain two DRAM chips 84a-84d. A set may be connected to the respective data buffers 90a-90n through the upper nibble. The other set may be connected to the respective data buffers 90a-90n through the lower nibble. For two set/eight DRAM chip 84a-84h implementations, each set may contain four of the DRAM chips 84a-84h. A set of four DRAM chips 84a-84d may connect to the respective data buffers 90a-90n through the upper nibble. The other set of four DRAM chips 84e-84h may connect to the respective data buffers 90a-90n through the lower nibble. Other numbers of sets, other numbers of DRAM chips, and other data unit sizes may be implemented to meet the design criteria of a particular implementation.

The DDR4 LRDIMM configuration may reduce a number of data loads to improve signal integrity on a data bus (e.g., the bus 30) of the memory module from a maximum of several (e.g., four) data loads down to a single data load. The distributed data buffers 90a-90n may allow DDR4 LRDIMM designs to implement shorter I/O trace lengths compared to DDR3 LRDIMM designs that use a centralized memory buffer. For example, shorter stubs connected to the memory channels 82a-82n may result in less pronounced signal reflections (e.g., improved signal integrity). In another example, the shorter traces may result in a reduction in latency (e.g., approximately 1.2 nanoseconds (ns), which is 50% less latency than DDR3 buffer memory). In yet another example, the shorter traces may reduce I/O bus turnaround time. For example, without the distributed data buffers 90a-90n (e.g., in DDR3 memory applications) traces would be routed to a centrally located memory buffer, increasing trace lengths up to six inches compared to the DDR4 LRDIMM implementation shown in FIG. 2.

In some embodiments, the DDR4 LRDIMM configuration may implement nine of the data buffers 90a-90n. The memory modules 50a-50n may implement 2 millimeter (mm) frontside bus traces and backside traces (e.g., the connectors/pins/traces 60). A propagation delay through the data buffers 90a-90n may be 33% faster than through a DDR3 memory buffer (e.g., resulting in reduced latency). In some embodiments, the data buffers 90a-90n may be smaller (e.g., a reduced area parameter) than a data buffer used for DDR3 applications.

Figure 3:
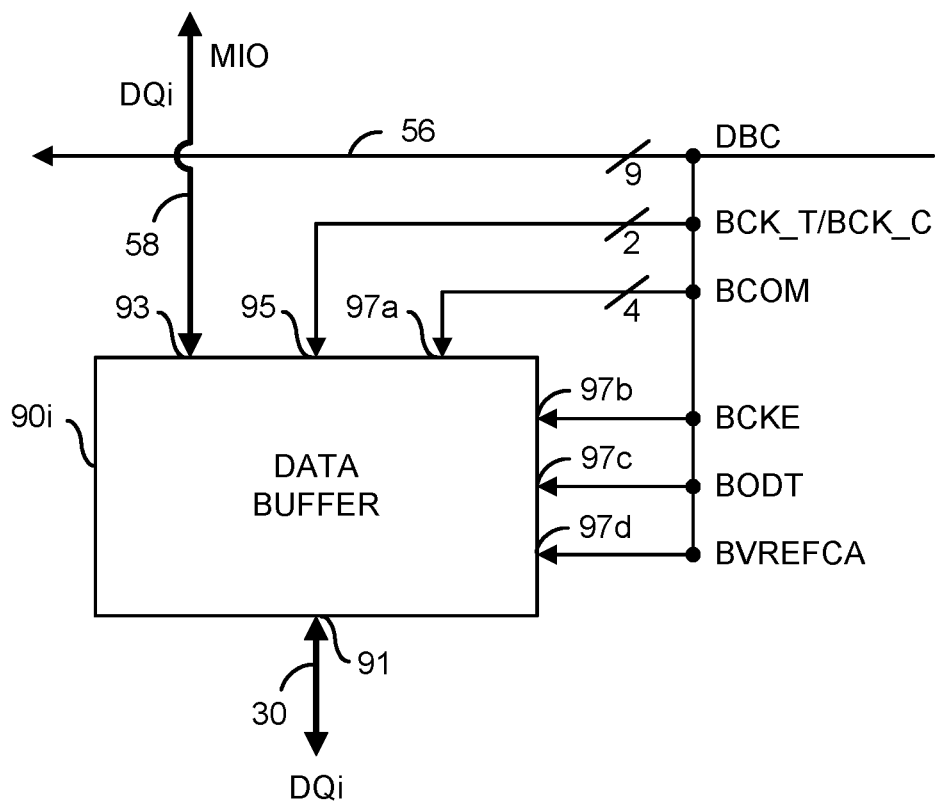
FIG. 3 is a block diagram illustrating input/output for a data buffer.

Referring to FIG. 3, a block diagram illustrating input/output for the data buffer 90i is shown. The data buffer 90i may be representative of the data buffers 90a-90n. The data buffer 90i is shown having an input/output 91 for presenting/receiving the signals DQi (e.g., the data signal DQ corresponding to the data path 80i and/or the data buffer 90i) on the bus 30. The data buffer 90i is shown having an input/output 93 for presenting/receiving one or more signals (e.g., MIO) to the bus 58. The signals MIO on the bus 58 may be transmitted between the DRAM chips 84a-84n and the data buffers 90a-90n. In an example, data from the memory controller 20 may be carried by the signal DQi on the bus 30, presented to the data buffer 90i, buffered in the data buffer 90i, then transmitted on the bus 58 to the memory channel 82i. For example, the bus 58 may transmit a version of the signal DQi (e.g., the signal MIO) between the data buffers 90a-90n and the corresponding memory channels 82a-82n). In another example, data from the memory channel 82i may be carried by the signal DQi on the bus 58, presented to the data buffer 90i, buffered in the data buffer 90i, then transmitted on the bus 30 to the memory controller 20.

The data buffer 90i is shown receiving the signals DBC. The signals DBC may be presented to each of the data buffers 90a-90n (e.g., using the data buffer control bus 56). The signals DBC are shown comprising five signals transmitted over 9 pins/bits (e.g., a signal BCK_T/BCK_C, a signal BCOM, a signal BCKE, a signal BODT and/or a signal BVREFCA). The data buffer 90i is shown having an input 95 for receiving the signals BCK_T/BCK_C, an input 97a for receiving the signal BCOM, an input 97b for receiving the signal BCKE, an input 97c for receiving the signal BODT, and an input 97d for receiving the signal BVREFCA.

The signal BCK_T/BCK_C may be a 2-bit signal representing clocks for the data buffers 90a-90n (e.g., comprised of a differential signal pair). The signal BCOM may be a 4-bit signal representing data buffer command signals (e.g., comprised of four pins/bits). The signal BCOM may be a unidirectional signal from the RCD circuit 102 to the data buffers 90a-90n. In an example, the signal BCOM may be implemented at a single data rate (e.g., 1 bit per signal per clock cycle). However, a particular command may take a different number of clock cycles to transfer information. The signal BCKE may be a function registered dedicated non-encoded signal (DCKE). The signal BODT may be a function registered dedicated non-encoded signals (DODT). The signal BVREFCA may be a reference voltage for command and control signals.

The data buffers 90a-90n may receive a set of data buffer commands (e.g., buffer control words (BCWs)) from the signals DBC. The buffer control words may be used to customize operation of the data buffers 90a-90n. The buffer control words may flow from the memory controller 20, through the RCD circuit 102, to the data buffers 90a-90n. The buffer control words may be similar to register commands (e.g., register control words (RCW)) used for the RCD circuit 102. Like the register control words (e.g., register commands), the buffer control words (e.g., buffer commands) may look like an MRS7 command, where the address lines are really the payload.

Since the bus 56 is nine pins, the RCD circuit 102 may do more than pass a buffer control word directly through to the data buffers 90a-90n. The RCD circuit 102 may convert (e.g., multiplex) an MRS7 command format into a buffer control word in a BOOM format. The RCD circuit 102 may map the 12 address bits of the MRS7 command into five separate data transfers, each 4 bits wide. The five data transfers may be set up over the bus 56, back to back. For example, 5 clock cycles plus a parity cycle may be used to complete the buffer command in the buffer control word. Once the buffer control word reaches the data buffers 90a-90n, the data buffers 90a-90n may decode the buffer control word, write the buffer control word to a function space of the data buffer, and complete the buffer command in the buffer control word.

A function of the signal BOOM may be to transmit the buffer control words. However, the JEDEC specification for DDR4 SDRAM also specifies that the RCD circuit 102 send all read/write commands and MRS information over the bus 56 (e.g., to allow the data buffers to keep tabs on what the DRAM chips 84a-84n are doing). In some embodiments, different buffer commands may take a different number of cycles to transfer the information.

The RCD circuit 102 may receive an MRS7 command from the memory controller 20 (e.g., from a host). For example, the host 10 may want to change a parameter (e.g., typically on boot up of a computing device). The RCD circuit 102 may check the MRS7 command to determine whether the address bit 12 is set to 1 (e.g., a logical one). When the address bit 12 of the MRS7 command is set to 1, the RCD circuit 102 may recognize the command as a buffer command (e.g., a command that is not meant for the RCD circuit 102). The RCD circuit 102 may convert the command from the memory controller 20 to a buffer control word and send the buffer control word to the bus 56 and then to the data buffers 90a-90n. The data buffer 90i may write the buffer control word to a function space to complete the command.

The data buffers 90a-90n may be configurable. The buffer commands may allow the memory controller 20 to customize aspects of termination, the signal strength on the DQ lines and/or events (e.g., receiver timing, driver timing, etc.) in both directions (e.g., for both read and write operations). In some embodiments, some of the configurations of the data buffers 90a-90n may be decided based on system level configurations. Generally, most of the configuration of the data buffers 90a-90n may be decided during training steps. During training steps, host controllers (e.g., the memory controller 20) may test and compare results of various training steps to determine an optimal configuration.

The bus 56 may be used to send commands/data to program configuration registers of the data buffers 90a-90n. The bus 56 may also send commands (e.g., data reads and/or data writes) that control data traffic through the data buffers 90a-90n. For example, some commands may optimize power consumption of the data buffers 90a-90n. In another example, read/write delays may be added per data line.

The data buffers 90a-90n may implement dual multi-bit (e.g., 4-bit) bidirectional data registers with differential data strobes. The data buffers 90a-90n may implement automatic impedance calibration. The data buffers 90a-90n may implement BCOM parity checking. The data buffers 90a-90n may implement control register buffer control word readback.

Figure 4:
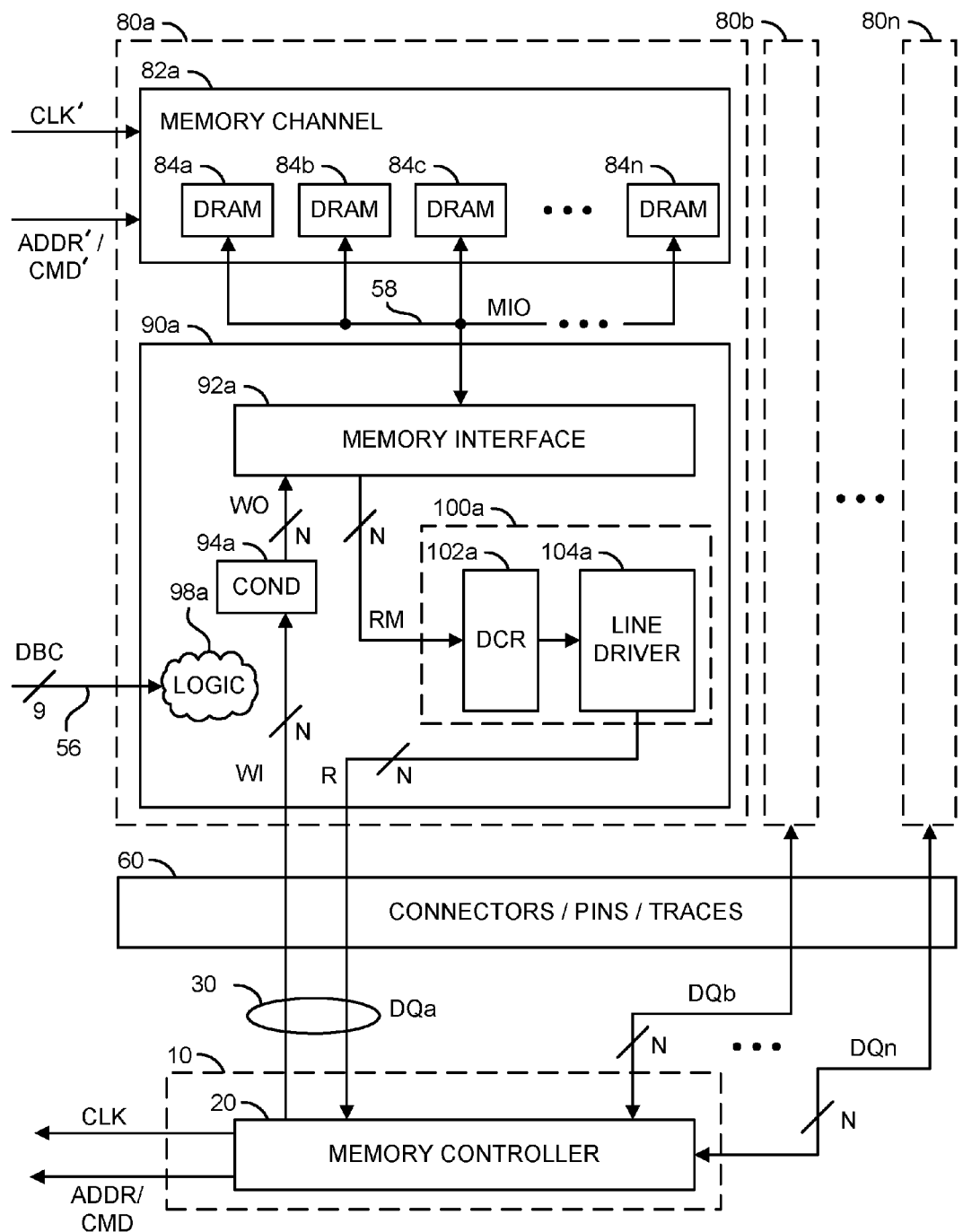
FIG. 4 is a block diagram illustrating a data path.

Referring to FIG. 4, a block diagram illustrating details of the data path 80a is shown. The data paths 80b-80n may have similar configurations. The memory controller 20 is shown generating/receiving the signal DQa over the data bus 30. Similar data signals DQb-DQn may be implemented for the data paths 80b-80n. The data signal DQa may include one or more read signals (e.g., R), and one or more write signals (e.g., WI). In some embodiments, the read signals may be single-ended signals (e.g., the signal R). In some embodiments, the read signals may be implemented as differential pairs. The data signal DQa may include other signals. The composition of the signals comprising DQa may be varied according to the design criteria of a particular implementation. The memory controller 20 may communicate with the data path 80a over the bus 30. The bus 30 may include the connectors/pins/traces 60.

The data buffer 90a may comprise a block (or circuit) 92a, a block (or circuit) 94a, a block (or circuit) 98a, a block (or circuit) 100a and/or input/output pins for the data bus 30 to/from the memory controller 20. The circuit 92a may be implemented as a memory interface. The circuit 94a may be implemented as a conditioner circuit. The data buffer 90a may comprise other logic components 98a. For example, the logic components 98a may receive data from the bus 56. The circuit 100a may implement a driver circuit. The type, arrangement and/or number of components of the data buffer 90a may be varied according to the design criteria of a particular implementation.

The memory interface 92a may comprise one or more output buffers (not shown). The memory interface 92a may receive a write signal (e.g., WO) from the conditioner circuit 94a. The write signal WO may be transmitted using single-ended lines or differential lines (e.g., traces), depending on the particular implementation. Where a differential write signal is implemented, the memory interface 92a may convert the differential write signal to a single-ended write signal. The single-ended write signal may be transmitted on the bus 58 (e.g., the signal MIO).

The memory interface 92a may receive the read data from the memory channel 82a (e.g., from the DRAM chips 84a-84n) over the bus 58. The memory interface 92a may present the read data in a read memory signal (e.g., RM) to the driver circuit 100a. The driver circuit 100a may generate the read signal R. Where a differential read signal is implemented, the circuit 100a may convert the signal-ended signal RM to the differential signal R. The digital logic 98a and/or other components of the memory interface 92a may be varied according to the design criteria of a particular implementation.

The circuit 94a may implement a conditioner circuit. The conditioner circuit 94a may be operational to buffer and condition write data received in the signal WI. The conditioner circuit 94a may present the write data in the signal WO to the circuit 92a. In various embodiments, the conditioner circuit 94a may generate the signal WO as a differential signal.

The circuit 100a may implement a driver circuit. The circuit 100a generally comprises a block (or circuit) 102a and a block (or circuit) 104a. The read memory signal RM may be received by the circuits 102a and 104a. The circuit 104a may generate the read signal R.

Multiple instantiations of the circuit 100a may be provided based on a width of the data exchanged with the DRAM chips 84a-84n and a number of sets of DRAM chips 84a-84n. For example, where each DRAM chip 84a-84n exchanges data in 4-bit units (e.g., nibbles) and two sets of DRAM chips 84a-84n are implemented, the width N of the data in the signals R and RM may be eight (e.g., an upper nibble and a lower nibble), and eight instantiations of the circuit 100a may be implemented.

The circuit 100a may implement an asymmetric driver. In an example, the asymmetric driver 100a may implement an asymmetric on-state resistance (e.g., Ron) driver. The asymmetric driver 100a may implement independently controllable pullup and/or pulldown on-state resistance values. In an example, the on-state resistance of the asymmetric driver 100a may be selected to improve (e.g., optimize) performance based on a number of DIMM slots in the memory channel 82a. In another example, the on-state resistance of the asymmetric driver 100a may be selected to improve (e.g., optimize) performance based on a data rate of the memory channel 82a. The parameters used to select the on-state resistance of the asymmetric driver 100a may be varied according to the design criteria of a particular implementation.

The circuit 102a may implement a driver control registers block. The circuit 104a may implement a line driver. The driver control registers block 102a may receive the read memory signal RM. The driver control registers block 102a may be used to select components of the line driver 104a (e.g., to generate the on-state resistance). The line driver 104a may be configured to generate the read signal R. The asymmetric driver 100a may comprise other components and/or logic. For example, one or more of the other components and/or logic 98a may be implemented as part of the asymmetric driver 100a. The components and/or logic of the asymmetric driver 100a may be varied according to the design criteria of a particular implementation.

The circuit 104a may implement a line driver (or buffer) circuit. The circuit 104a is generally operational to generate the read signal R on a wire (or trace, or node, or transmission line) based on the read data in the read memory signal RM and the selection from the driver control registers block 102a. The line driver circuit 104a may be configured to generate an asymmetric voltage swing for the read signal R with respect to an internally generated reference voltage. The asymmetric voltage swing may be based on the components of the line driver circuit 104a selected by the driver control registers block 102a.

Figure 5:
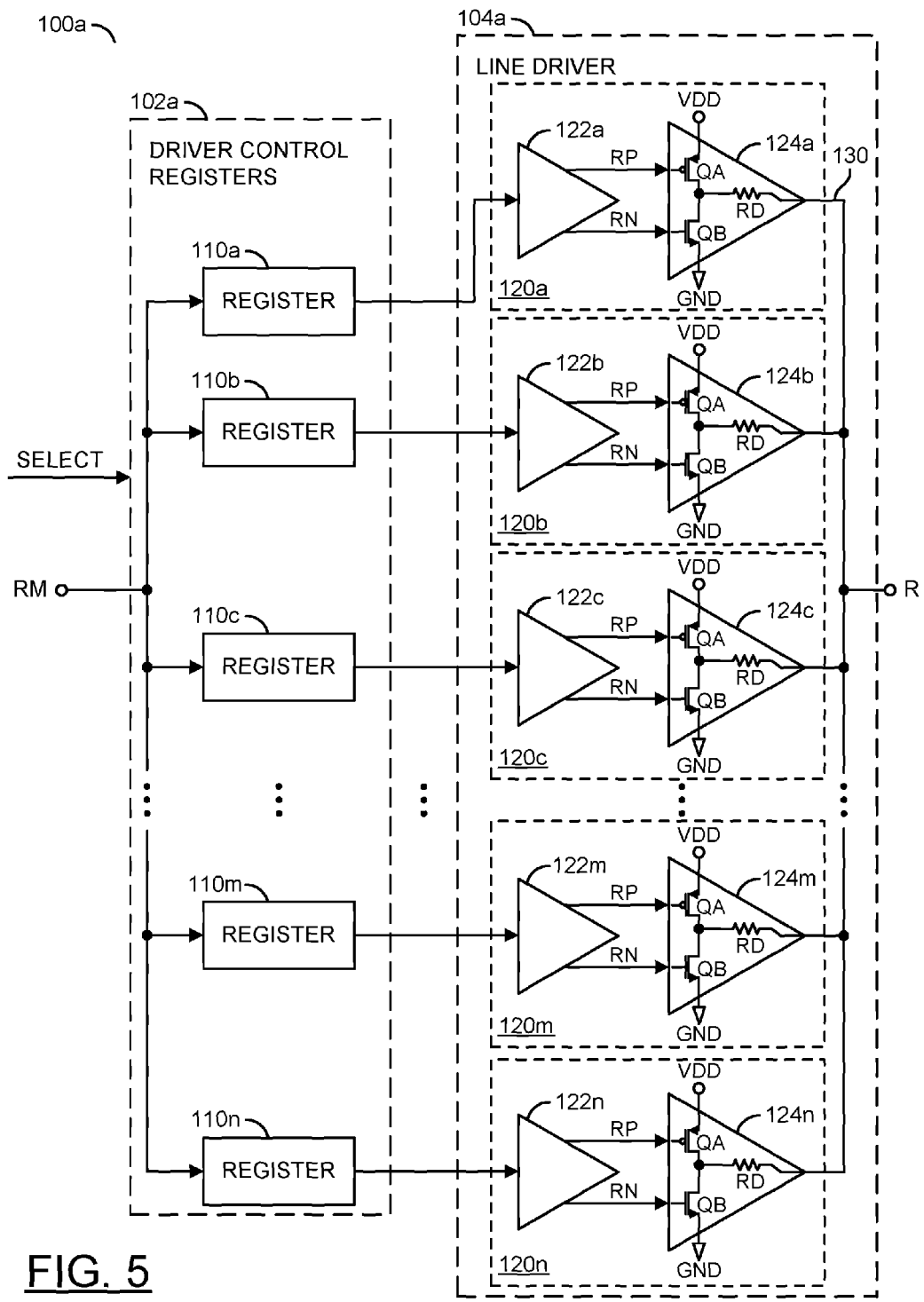
FIG. 5 is a detailed block diagram of a driver circuit in accordance with an embodiment of the present invention.

Referring to FIG. 5, detailed block diagrams of the components of the circuit 100a are shown in accordance with an embodiment of the present invention. The driver control registers block 102a may receive the read memory signal RM. The driver control registers block 102a may receive a signal (e.g., SELECT). In an example, one or more of the other components and/or logic 98a may generate the signal SELECT. The driver control registers block 102a generally comprises blocks (or circuits) 110a-110n. In various embodiments, the circuits 110a-110n may be implemented in hardware circuitry. However, executable code (e.g., software, firmware, microcode, programming instructions, etc.) embodied in a storage medium may be used to represent the circuits 110a-110n in operations (e.g., design, modeling, simulation, tape out, etc.) utilizing one or more electronic design tools. The circuits 110a-110n may be registers. Each of the registers 110a-110n may be configured to present an output to the line driver 104a.

The read memory signal RM may be received by the registers 110a-110n. The registers 110a-110n may be configured to select a driver on-state resistance value generated by the line driver 104a. In some embodiments, the signal SELECT may be configured to select driver units of the line driver 104a to modify a strength of the pullup/pulldown for the read signal R. For example, the strength of the pullup/pulldown for the read signal R may be an amount of voltage swing around half VDD (e.g., VDD may be a voltage of an internally generated reference signal). In an example, the registers 110a-110n may comprise control and status (CSR) registers. In another example, the registers 110a-110n may comprise OTP (one time programmable) bits. For example, one or more of the registers 110a-110n may be selected by breaking laser fuses and/or engaging anti-fuses. The implementation of the registers 110a-110n may be varied according to the design criteria of a particular implementation.

The line driver circuit 104a may receive output from the driver control registers block 102a. The output may be generated in response to the read memory signal RM and/or the registers 110a-110n selected. The line driver circuit 104a may be configured to generate the read signal R. The line driver 104a generally comprises blocks (or circuits) 120a-120n. Each of circuits 120a-120n may be a driver unit. The driver units 120a-120n may be enabled before installation of the memory module 50a (or the data buffer 90a).

The driver units 120a-120n may comprise blocks (or circuits) 122a-122n and/or blocks (or circuits) 124a-124n. In various embodiments, the circuits 122a-122n and/or 124a-124n may be implemented in hardware circuitry. However, executable code (e.g., software, firmware, microcode, programming instructions, etc.) embodied in a storage medium may be used to represent the circuits 122a-122n and/or 124a-124n in operations (e.g., design, modeling, simulation, tape out, etc.) utilizing one or more electronic design tools. The number of the driver units 120a-120n implemented may be varied according to the design criteria of a particular implementation. The circuit 122a may be representative of the circuits 122a-122n. The circuit 124a may be representative of the circuits 124a-124n.

The circuit 122a may implement a pre-driver circuit. The circuit 122a is generally operational to generate one of a pair of signals (e.g., RP and RN) based on the read memory signal RM and the selection of the driver control registers block 102a. The signal RP may be received by a pull up input port of the circuit 124a. The signal RN may be received by a pull down input port of the circuit 124a. While the read memory signal RM is in the high state, the signals RP and/or RN may cause the circuit 124a to drive the read signal R to the positive rail VDD. While the read memory signal RM is in the low state, the signals RP and/or RN may cause the circuit 124a to drive the read signal R to the negative rail GND.

The signals RP and RN of each of the pre-driver circuits 122a-122n may be disabled independently of the other. For example, when the signal RP is enabled, the signal RN may be disabled. In another example, when the signal RN is enabled, the signal RP may be disabled. In some embodiments, the signals RP and/or RN may be gated (e.g., based on logic in the pre-driver circuits 122a-122n) such that one of the signals RP/RN may be disabled independently of the other one of the signals RP/RN in each of the driver units 120a-120n.

Implementing logic to gate the signals RP and RN such that one of the signals RP/RN may be disabled independently of the other one of the signals RP/RN may prevent both a pull up leg and a pull down leg from being enabled at the same time when a particular one of the driver units 120a-120n is selected (e.g., preventing a symmetric on-state resistance). In an example, when one of the driver units 120a-120n has the signal RP enabled, the signal RN may be disabled. In another example, when one of the driver units 120a-120n has the signal RN enabled, the signal RP may be disabled. In some embodiments, the signal SELECT may be used by the registers 110a-110n to select which of the signals RP or RN to select when activating the driver units 120a-120n. The implementation of the logic to control the signals RP and/or RN may be varied according to the design criteria of a particular implementation.

The circuit 124a may implement a driver circuit. The circuit 124a is generally operational to pull the read signal R up to the positive rail VDD or down to the negative rail GND. The circuit 124a generally comprises a pair of devices (or transistors) QA and QB and an impedance device (or resistors) RD. In an example, the impedance RD may be a 240 ohm resistance. The signal VDD and/or the signal GND may be an internally generated reference voltage. In some embodiments, the signals VDD and/or GND may be generated by the circuit 100a. In some embodiments, the signals VDD and/or GND may be generated by the memory module 50a.

The read signal R may be pulled up through the resistor RD to the positive rail VDD while the transistor QA is switched on (or conductive). While the transistor QA is switched off (or nonconductive), the read signal R may see a high impedance to the positive rail VDD. The read signal R may be pulled down through the resistors RD to the negative rail GND while the transistor QB is switched on (or conductive). While the transistor QB is switched off (or nonconductive), the read signal R may see a high impedance to the negative rail GND.

In various embodiments, the impedance value of the resistors RD may be selected to provide proper termination of the wire 130 carrying the read signal R. A resistance value of each resistor RD generally ranges from 20 to 500 ohms. In some embodiments, the normal termination impedance may be specified to match a standard impedance value (e.g., 34 ohms according to the DDR4 standard). In one example, the driver units 120a-120n may be selected to provide the on-state resistance of 34 ohms. In another example, the driver units 120a-120n may be selected to provide the on-state resistance to implement one or more asymmetric pullup/pulldown strengths.

In some embodiments, each one of the individual driver units 120a-120n may be calibrated with an off-chip calibration resistor. The registers 110a-110n may be configured to select a different number of the driver units 120a-120n. By selecting different combinations of the driver units 120a-120n, different pullup on-state resistance values and different pulldown on-state resistance values may be achieved. By selecting the different combinations of the driver units 120a-120n, the impedances RD in each of the selected driver units 120a-120n may operate in parallel. For example, if the impendence value RD for each of the driver units 120a-120n is 240 ohms, 6 of the driver units 120a-120n may be selected to achieve a 40 ohms pull up Ron (e.g., RD || RD || RD || RD || RD || RD=40 ohms), 7 of the driver units 120a-120n may be selected to achieve a 34 ohm resistance for the standard impedance value (e.g., RD || RD || RD || RD || RD || RD || RD=34 ohms) and 9 of the driver units 120a-120n may be selected to achieve a 27 ohms pulldown Ron (e.g., RD || RD || RD || RD || RD || RD || RD || RD || RD=27 ohms).

In some embodiments, by controlling how different combinations of the driver units 120a-120n are turned on, an output slew rate may be adjusted. Adjusting the output slew rate may further improve (e.g., optimize) signal integrity. The slew rate may be adjusted by setting up slice delays and turning on different amounts of the driver units 120a-120n during each individual slice delay.

The asymmetric Ron driver 104a may improve and/or optimize by both reducing high side reflection and driving stronger low side levels to improve/optimize a host receiver margin. Conventional drivers using a symmetric pullup/pulldown Ron may not be optimal for VDD referenced DDR4 POD12 signaling. By using different pullup and pulldown strengths, the circuit 100a may provide a better margin at the host receiver 10.

Figure 6:
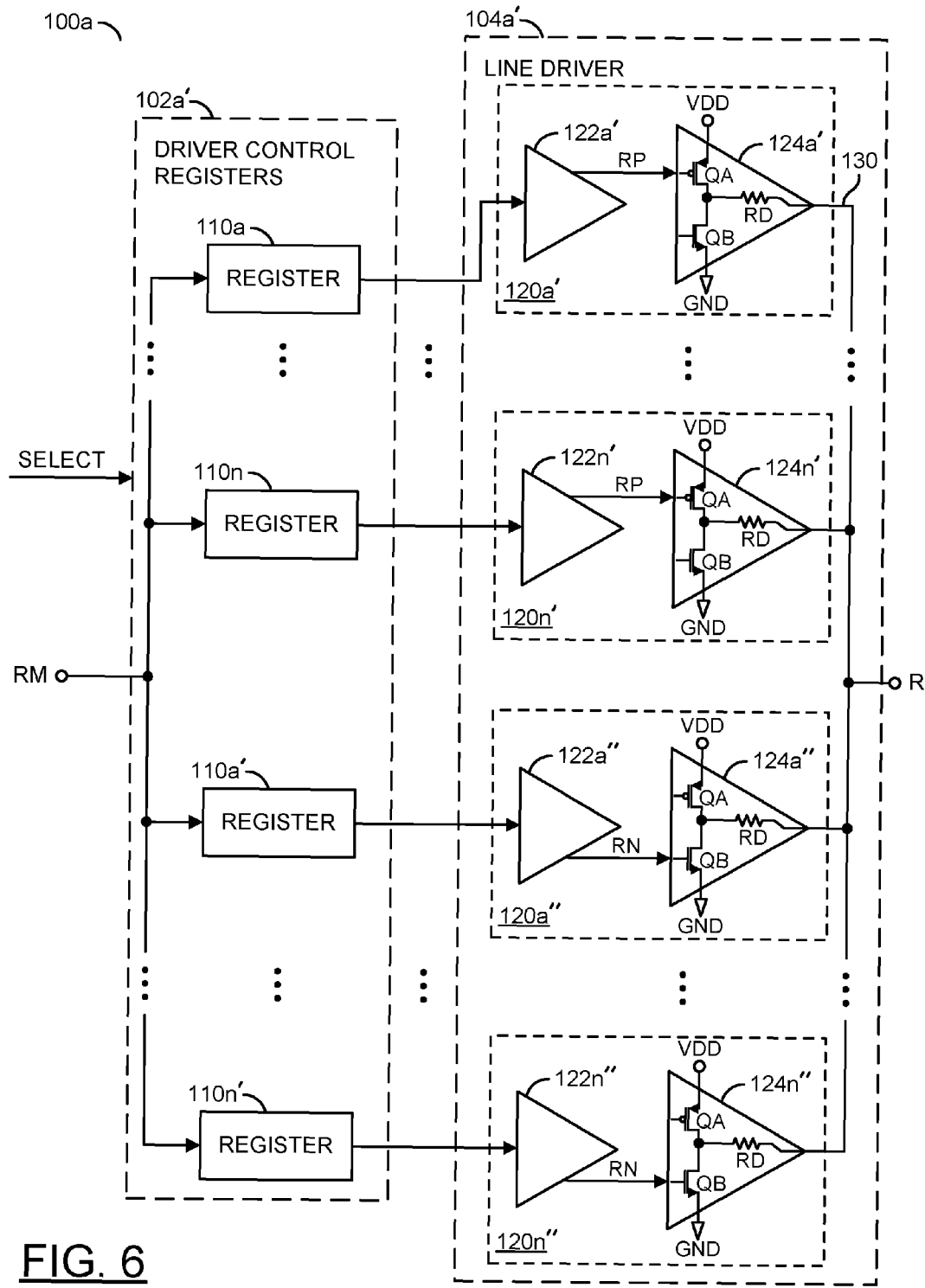
FIG. 6 is a detailed block diagram of an alternate driver circuit in accordance with an embodiment of the present invention.

Referring to FIG. 6, alternate detailed block diagrams of the components of the circuit 100a are shown in accordance with an embodiment of the present invention. The circuit 100a may comprise the driver control registers block 102a' and the line driver 104a'. In various embodiments, the circuits 102a' and/or 104a' may be implemented in hardware circuitry. However, executable code (e.g., software, firmware, microcode, programming instructions, etc.) embodied in a storage medium may be used to represent the circuits 102a' and 104a' in operations (e.g., design, modeling, simulation, tape out, etc.) utilizing one or more electronic design tools.

The driver control registers block 102a' may comprise one set of registers 110a-110n and another set of registers 110a'-110n'. Each of the registers 110a-110n and 110a'-110n' may be configured to present an output to the line driver 104a' in response to the read memory signal RM and/or the signal SELECT. In the example shown, the registers 110a-110n may be configured to select the driver units 120a'-120n' of the line driver 104a' for the pull up leg and the registers 110a'-110n' may be configured to select the driver units 120a"-120n" of the line driver 104a' for the pull down leg. Alternatively, the registers 110a'-110n' may be configured to select the driver units 120a'-120n' of the line driver 104a' for the pull up leg and the registers 110a-110n may be configured to select the driver units 120a"-120n" of the line driver 104a' for the pull down leg. For example, the signal SELECT may be implemented to select one or more of the registers 110a-110n during the pull up leg and select one or more of the registers 110a'-110n' during the pull down leg.

The arrangement of the registers 110a-110n and 110a'-110n' may be varied according to the design criteria of a particular implementation.

The line driver 104a' may comprise one set of driver units 120a'-120n' and another set of driver units 120a"-120n". The driver units 120a'-120n' may be configured to implement the pull up leg for the read signal R. The driver units 120a"-120n" may be configured to implement the pull down leg for the read signal R. The number of driver units 120a'-120n' and/or 120a"-120n" may be varied according to the design criteria of a particular implementation.

The pre-driver circuits 122a'-122n' of the driver units 120a'-120n' may be configured to generate the signal RP. The pre-driver circuits 122a'-122n' of the driver units 120a'-120n' may not provide a signal RN. Similarly, the pre-driver circuits 122a"-122n" of the driver units 120a"-120n" may be configured to generate the signal RN and not generate the signal RP.

The read signal R may be pulled up through the resistor RD to the positive rail VDD while the transistor QA is switched on (or conductive) in response to the signal RP generated by the pre-driver circuits 122a'-122n'. While the transistor QA is switched off (or nonconductive), the read signal R may see a high impedance to the positive rail VDD. The read signal R may be pulled down through the resistors RD to the negative rail GND while the transistor QB is switched on (or conductive) in response to the signal RN generated by the pre-driver circuits 122a"-122n". While the transistor QB is switched off (or nonconductive), the read signal R may see a high impedance to the negative rail GND.

In an example for the pull up leg, the signal SELECT may be used to enable a number of the registers 110a-110n. The registers 110a-110n activated by the signal SELECT may enable the driver units 120a'-120n' to generate the on-state resistance for the pull up leg. In an example for the pull down leg, the signal SELECT may be used to enable a number of the registers 110a'-110n'. The registers 110a'-110n' activated by the signal SELECT may enable the driver units 120a"-120n" to generate the on-state resistance for the pull down leg.

Generally, a different number of the pull up driver units 120a'-120n' may be enabled for the pull up leg than the number of the pull down driver units 120a'-120n' enabled for the pull down leg. For example, if the impendence value RD for each of the driver units 120a'-120n' and 120a"-120n" is 240 ohms, 6 of the driver units 120a'-120n' may be selected to achieve a 40 ohms pull up Ron and 9 of the driver units 120a"-120n" may be selected to achieve a 27 ohms pulldown Ron. The asymmetric on-state resistance may be implemented when the on-state resistance of the pull up leg is different than the on-state resistance of the pull down leg.

In some embodiments, the driver units 120a'-120n' and/or the driver units 120a"-120n" may be selected as pull up or pull down driver units by breaking one or more laser fuses. In some embodiments, the driver units 120a'-120n' and/or the driver units 120a"-120n" may be selected as pull up or pull down driver units by engaging one or more anti-fuses. The driver units 120a'-120n' and/or the driver units 120a"-120n" may be enabled before installation of the memory module 50a and/or the data buffer 90a. For example, by breaking a laser fuse the driver units 120a'-120n' may disable the signal RN (e.g., a connection to the transistor QB) so that only the signal RP is enabled when the driver units 120a'-120n' are selected. In another example, by breaking a laser fuse the driver units 120a"-120n" may disable the signal RP (e.g., a connection to the transistor QA) so that only the signal RN is enabled when the driver units 120a"-

120n" are selected. The method for modifying the driver units 120a-120n to operate as the pull up driver units 120a'-120n' or the pull down driver units 120a"-120n" may be varied according to the design criteria of a particular implementation.

Figure 7:
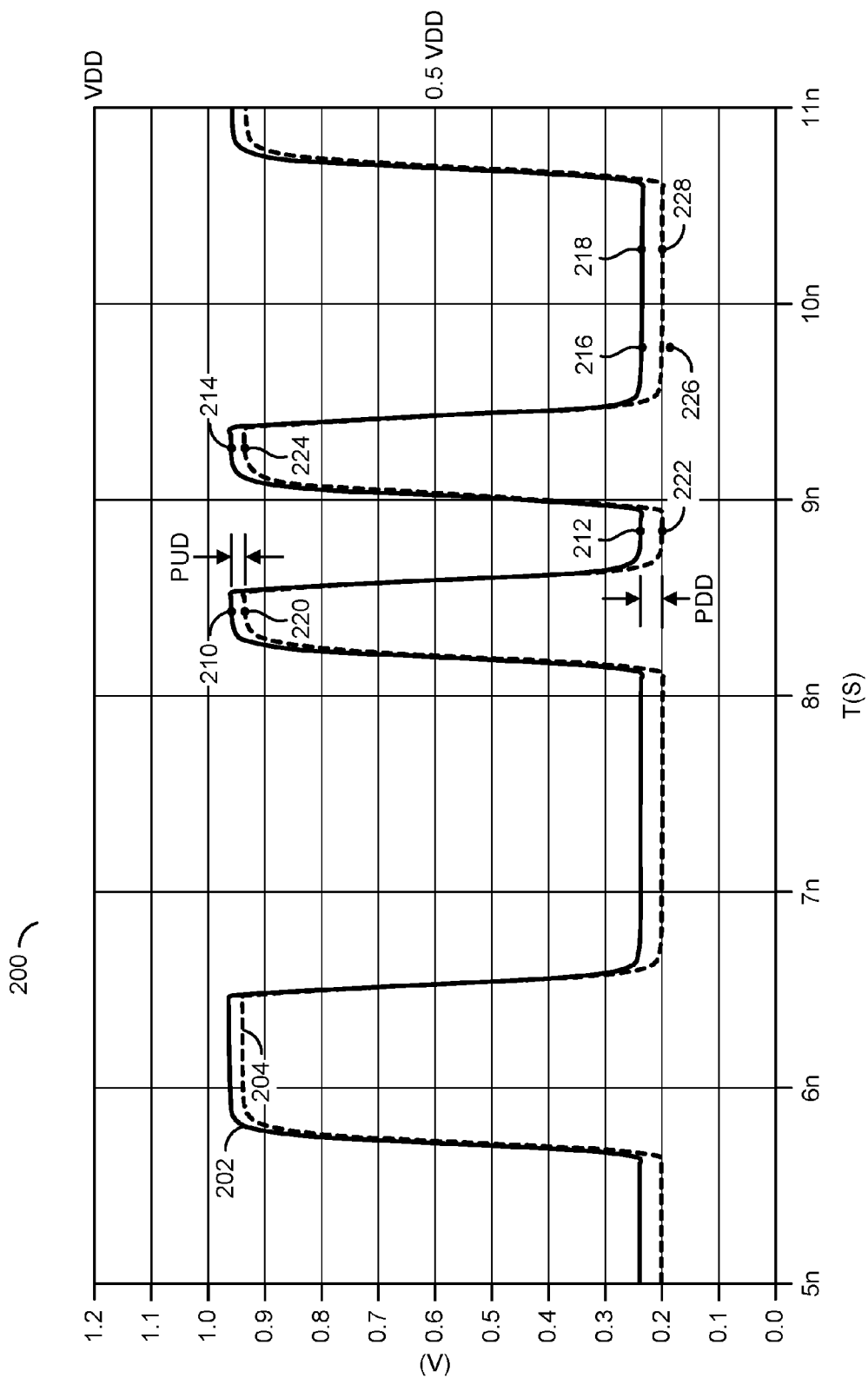
FIG. 7 is a graph of an example simulated waveform generated by a symmetric driver and an example simulated waveform generated by an asymmetric driver.

Referring to FIG. 7, a graph 200 of an example simulated waveform generated by a symmetric driver and an example simulated waveform generated by an asymmetric driver is shown. The waveforms may represent a data signal over time (e.g., 10 cycles). The data signal may be high or low for one or more cycles or change between high and low based on data stored in the DRAM circuits 84a-84n. An x-axis of the graph 200 may represent time (e.g., measured in seconds) in a range of 5 nanosecond to 11 nanoseconds. A y-axis of the graph 200 may represent a voltage of the read signal R. In the example, the wire 130 may be driven into a 50 ohm load terminated to half VDD. In the example shown, VDD may have a value of 1.2V and the half VDD value may be 0.6V. The waveform 202 may be generated in response to a symmetric (e.g., 34/34 ohm) driver. The waveform 204 may be generated in response to an asymmetric (e.g., 40/27 ohm) driver (e.g., the line driver 104a). The waveforms 202 and 204 may swing around the half VDD value 0.6V. The voltage swing may represent a pull up strength (e.g., high side of the voltage swing) and/or a pull down strength (e.g., low side of the voltage swing) of the memory signal R.

Since the waveform 202 is generated in response to a symmetric driver, the waveform 202 may be presented as a symmetric swing. A point 210 on the waveform 202 may be an example of a high side swing (e.g., the signal R is pulled up towards VDD). The point 210 may be at a voltage of around 0.95V. A difference between the point 210 and the half VDD may be around 0.35V. A point 212 on the waveform 202 may be an example of a low side swing (e.g., the signal R is pulled down towards GND). The point 212 may be at a voltage of around 0.25V. The difference between the point 212 and the half VDD may be around 0.35V. For the symmetric waveform 202, the difference between half VDD and the high side swing and the difference between half VDD and the low side swing is equal (e.g., 0.35V).

Points 214, 216 and 218 may be other points on the waveform 202. For example, the waveform 202 may be pulled up to the point 210 during one cycle. The waveform 202 may then be pulled down to the point 212 in the next cycle. The waveform 202 may be pulled up to the point 214 during the next cycle. The waveform 202 may be pulled down to the point 216 in the next cycle. The waveform 202 may remain at the low side swing at the point 218 in the next cycle. The points 210-218 may represent a value of the signal R over time. The values of the signal R may represent logical high or logical low values of the data stored in the DRAM modules 84a-84n.

Since the waveform 204 is generated in response to an asymmetric driver (e.g., the line driver 104a), the waveform 204 may be presented as an asymmetric swing. A point 220 on the waveform 204 may be an example of a high side swing (e.g., the signal R is pulled up towards VDD). The point 220 may be at a voltage of around 0.925V. A difference between the point 220 and the half VDD may be around 0.325V. A point 222 on the waveform 204 may be an example of a low side swing (e.g., the signal R is pulled down towards GND). The point 222 may be at a voltage of around 0.2V. The difference between the point 222 and the half VDD may be around 0.4V. For the asymmetric waveform 204, the difference between half VDD and the high side swing (e.g., 0.325) and the difference between half VDD and the low side swing (e.g., 0.4V) is different (e.g., asymmetrical).

Points 224, 226 and 228 may be other points on the waveform 204. For example, the waveform 204 may be pulled up to the point 220 during one cycle. The waveform 204 may then be pulled down to the point 222 in the next cycle. The waveform 204 may be pulled up to the point 224 during the next cycle. The waveform 204 may be pulled down to the point 226 in the next cycle. The waveform 204 may remain at the low side swing at the point 228 in the next cycle. The points 220-228 may represent a value of the signal R over time. The values of the signal R may represent logical high or logical low values of the data stored in the DRAM modules 84a-84n.

In the example shown, the asymmetric waveform 204 may be generated by a 40/27 ohm driver. The pull up leg may be a 40 ohm resistance. The pull down leg may be a 27 ohm resistance. The symmetric waveform 202 may be generated by a 34/34 ohm driver. Since the pull up leg for the asymmetric waveform 204 has a larger on-state resistance (e.g., 40 ohm) than the pull up leg for the symmetric waveform 202 (e.g., 34 ohm) the high side voltage of the waveform 204 is lower (e.g., farther from VDD and closer to half VDD). The difference between the pull up voltage of the waveform 202 (e.g., 0.95V) and the pull up voltage of the asymmetric waveform 204 (e.g., 0.925V) may be 0.025V (e.g., the pull up difference (PUD)). Since the pull down leg for the asymmetric waveform 204 has a smaller on-state resistance (e.g., 27 ohm) than the pull down leg for the symmetric waveform 202 (e.g., 34 ohm) the low side voltage of the waveform 204 is lower (e.g., closer to GND and farther from half VDD). The difference between the pull down voltage of the waveform 202 (e.g., 0.25V) and the pull down voltage of the asymmetric waveform 204 (e.g., 0.4V) may be 0.15V (e.g., the pull down difference (PDD)).

The higher on-state resistance for the pull up leg than the on-state resistance for the pull down leg for the asymmetric waveform 204 may result in the line driver 104a having a smaller high side swing (e.g., a lesser pull up strength for the memory signal R), but a larger low side swing (e.g., a greater pull down strength for the memory signal R) compared to the symmetric waveform 202. Since the difference between the pull up resistance of the symmetric waveform 202 and the pull up resistance of the asymmetric waveform 204 is less than the difference between the pull down resistance of the symmetric waveform 202 and the pull down resistance of the asymmetric waveform 204, the pull up difference is less than the pull down difference between the waveforms.

Generally, the asymmetrical line driver 104a-104n may adjust the voltage swing (e.g., increase or decrease the pull up or pull down strength) of the read signal R. The pull up strength and/or pull down strength may be based on an internally generated signal (e.g., the signal VDD). The asymmetrical line driver 104a-104n may enable a different pull up strength than a pull down strength. In an example, one of the asymmetric line drivers 104a-104n may generate an asymmetric waveform by having a larger high side swing than low side swing (e.g., a greater amount of pull up strength on each positive transition of the read signal R than an amount of pull down strength on each negative transition of the read signal R). In another example, one of the asymmetric line drivers 104a-104n may generate an asymmetric waveform by having a larger low side swing than high side swing (e.g., a greater amount of pull down strength on each negative transition of the read signal R than an amount of pull up strength on each positive transition of the read signal R). The amount of pull up strength and/or pull down strength may be varied according to the design criteria of a particular implementation.

The asymmetrical line driver 104a-104n of the present invention generally improves output eye performance. The improved output eye performance may benefit reliability, data transfer frequencies and/or receiver margin testing. The ability to adjust the strength (e.g., independently adjust the high side voltage swing and the low side voltage swing) may enable customization of the output signal R to various conditions of the memory module (or board or card), the connectors, the pins, the traces and/or the motherboard.

While FIG. 4 shows the driver circuit 100a in the context of the data buffer circuit 90a sending read data during read cycles, copies of the driver circuits 100a-100n may be implemented at other locations, other data paths and/or other control paths. In various embodiments, copies of the driver circuits 100a-100n may be located at the other end of the data bus 30 to improve various signals generated by the host circuit 10 during write cycles. For example, the memory controller 20 may include copies of the driver circuits 100a-100n to modify the write data sent in the signals DQa-DQn to the memory modules 50a-50n. In another example, copies of the driver circuits 100a-100n may be included in the memory controller 20 to modify address, command data and/or clocking signals sent across the data bus 30. Instances of the driver circuits 100a-100n may also be implemented in other circuitry within the memory modules 50a-50n. For example, copies of the driver circuits 100a-100n may be included in the RCD circuit 102 to modify signals sent across the data bus 30.

The functions and structures illustrated in the diagrams of FIGS. 1 to 7 may be designed, modeled, emulated, and/or simulated using one or more of a conventional general purpose processor, digital computer, microprocessor, microcontroller, distributed computer resources and/or similar computational machines, programmed according to the teachings of the present specification, as will be apparent to those skilled in the relevant art(s). Appropriate software, firmware, coding, routines, instructions, opcodes, microcode, and/or program modules may readily be prepared by skilled programmers based on the teachings of the present disclosure, as will also be apparent to those skilled in the relevant art(s). The software is generally embodied in a medium or several media, for example non-transitory storage media, and may be executed by one or more of the processors sequentially or in parallel.

Embodiments of the present invention may also be implemented in one or more of ASICs (application specific integrated circuits), FPGAs (field programmable gate arrays), PLDs (programmable logic devices), CPLDs (complex programmable logic device), sea-of-gates, ASSPs (application specific standard products), and integrated circuits. The circuitry may be implemented based on one or more hardware description languages. Embodiments of the present invention may be utilized in connection with flash memory, nonvolatile memory, random access memory, read-only memory, magnetic disks, floppy disks, optical disks such as DVDs and DVD RAM, magneto-optical disks and/or distributed storage systems.

Although embodiments of the invention have been described in the context of a DDR4 application, the present invention is not limited to DDR4 applications, but may also be applied in other high data rate digital communication applications where different transmission line effects, cross-coupling effects, traveling wave distortions, phase changes, impedance mismatches and/or line imbalances may exist.

The present invention addresses concerns related to high-speed communications, flexible clocking structures, specified command sets and lossy transmission lines. Future generations of DDR can be expected to provide increasing speed, more flexibility, additional commands and different propagation characteristics. The present invention may also be applicable to memory systems implemented in compliance with either existing (legacy) memory specifications or future memory specifications.

While the invention has been particularly shown and described with reference to the preferred embodiments thereof, it will be understood by those skilled in the art that various changes in form and details may be made without departing from the scope of the invention.

The invention claimed is:

1. An apparatus comprising:
a plurality of driver circuits configured to drive a read line in response to a memory signal and a reference voltage to transfer read data across said read line to a memory controller; and
a plurality of control registers configured to enable a first number of said driver circuits to operate solely as pull up drivers and a second number of said driver circuits to operate solely as pull down drivers, wherein (a) a pull up strength and a pull down strength of said memory signal is configured in response to how many of said plurality of driver circuits are enabled as said pull up drivers and said pull down drivers, respectively, and (b) said plurality of driver circuits and said plurality of control registers implement an asymmetric voltage swing of said read line about a voltage level that is half of said reference voltage by setting said first number different from said second number.

2. The apparatus according to claim 1, wherein said asymmetric voltage swing comprises a greater amount of pull up strength on each positive transition of said memory signal than an amount of pull down strength on each negative transition of said memory signal.

3. The apparatus according to claim 1, wherein said asymmetric voltage swing comprises a greater amount of pull down strength on each negative transition of said memory signal than an amount of pull up strength on each positive transition of said memory signal.

4. The apparatus according to claim 1, wherein said memory signal carries said read data from a memory channel.

5. The apparatus according to claim 1, wherein said plurality of driver circuits are configured as said pull up drivers and said pull down drivers before installation of said apparatus.

6. The apparatus according to claim 1, wherein said plurality of driver circuits are configured by breaking one or more laser fuses.

7. The apparatus according to claim 1, wherein said plurality of driver circuits are configured by engaging one or more anti-fuses.

8. The apparatus according to claim 1, wherein said apparatus forms part of a data buffer of a memory module.

9. The apparatus according to claim 8, wherein said memory module comprises a double data rate fourth generation synchronous dynamic random-access memory module.

10. The apparatus according to claim 9, wherein said asymmetric voltage swing of said read line operates outside of a specification for said double data rate fourth generation synchronous dynamic random-access memory module.

11. The apparatus according to claim 1, wherein said apparatus implements (i) a 40 ohm on-state resistance for said pull up strength of said memory signal and (ii) a 27 ohm on-state resistance for said pull down strength of said memory signal.

12. The apparatus according to claim 11, wherein (i) each of said driver circuits implements a 240 ohm resistance, (ii) six of said driver circuits are enabled to operate solely as said pull up drivers to implement said pull up strength for said memory signal and (iii) nine of said driver circuits are enabled to operate solely as said pull down drivers to implement said pull down strength for said memory signal.

13. The apparatus according to claim 1, wherein said plurality of driver circuits are each configured to be independently enabled either as one of said pull up drivers or one of said pull down drivers.

14. The apparatus according to claim 1, wherein said pull up strength implements an first amount of voltage swing of said memory signal above an internally generated reference voltage, said pull down strength implements a second amount of voltage swing of said memory signal below said internally generated reference voltage, and said internally generated reference voltage is half of a positive rail voltage.

15. The apparatus according to claim 14, wherein said driver circuits comprise (i) a first set of said driver circuits for implementing a pull up leg configured to provide a positive portion of said asymmetric voltage swing of said memory signal relative to said internally generated reference voltage and (ii) a second set of said driver circuits for implementing a pull down leg configured to provide a negative portion of said asymmetric voltage swing of said memory signal relative to said internally generated reference voltage.

16. An apparatus comprising:
a first plurality of driver circuits configured to provide a pull up strength of a memory signal that transfers read data across a read line to a memory controller;
a second plurality of driver circuits configured to provide a pull down strength of said memory signal; and
a plurality of control registers configured to enable one or more of said first plurality of driver circuits and one or more of said second plurality of driver circuits, wherein (a) said pull up strength of said memory signal is configured in response to how many of said first plurality of driver circuits are enabled, (b) said pull down strength of said memory signal is configured in response to how many of said second plurality of driver circuits are enabled and (c) different numbers of said first plurality of driver circuits and said second plurality of driver circuits are enabled to implement an asymmetric voltage swing of said memory signal about an internally generated reference voltage.

17. The apparatus according to claim 16, wherein each of said control registers is implemented as one time programmable memory.

18. The apparatus according to claim 17, wherein said plurality of driver circuits are configured by at least one of breaking one or more laser fuses and engaging one or more anti-fuses.

19. The apparatus according to claim 16, wherein a difference between the number of said first plurality of driver circuits and the number of said second plurality of driver circuits is based on a number of memory slots connected to said read line.

20. The apparatus according to claim 1, wherein said difference between said first number and said second number is based on a number of memory slots connected to said read line.

* * * * *